(12) United States Patent
Plasa

(10) Patent No.: US 6,291,287 B1
(45) Date of Patent: *Sep. 18, 2001

(54) METHOD FOR PRODUCING A MEMORY CELL

(75) Inventor: Gunther Plasa, Bernau (DE)

(73) Assignee: Infineon Technologies AG, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/020,872

(22) Filed: Feb. 9, 1998

Related U.S. Application Data

(63) Continuation of application No. PCT/DE96/01477, filed on Aug. 7, 1996.

(30) Foreign Application Priority Data

Aug. 7, 1995 (DE) .............................. 195 28 991

(51) Int. Cl.$^7$ ..................... H01L 21/8242; H01L 21/336
(52) U.S. Cl. .......................................... 438/239; 438/257
(58) Field of Search ................................ 438/257, 552, 438/239, 260, 263, 264

(56) References Cited

U.S. PATENT DOCUMENTS

| | | |
|---|---|---|
| 4,400,867 | 8/1983 | Fraser . |
| 4,445,266 * | 5/1984 | Mai et al. ................ 29/571 |
| 4,490,193 * | 12/1984 | Ishaq et al. ............. 148/188 |
| 4,837,176 * | 6/1989 | Zdebel et al. ........... 438/552 |
| 4,927,780 * | 5/1990 | Roth et al. ............... 437/69 |
| 5,109,258 | 4/1992 | Redwine . |
| 5,151,378 * | 9/1992 | Ramde ..................... 437/31 |
| 5,393,686 * | 2/1995 | Yeh et al. ................ 438/257 |
| 5,786,263 * | 6/1998 | Perera ..................... 438/431 |
| 5,866,453 * | 2/1999 | Prall et al. .............. 438/253 |
| 5,895,250 * | 4/1999 | Wu .......................... 438/396 |

FOREIGN PATENT DOCUMENTS

| | | |
|---|---|---|
| 2520047 | 12/1975 | (DE) . |
| 2739662 | 3/1979 | (DE) . |
| 0294699A2 | 12/1988 | (EP) . |
| 57-42169 | 3/1982 | (JP) . |

OTHER PUBLICATIONS

IEEE Transactions on Electron Devices, Oct. 1984, vol. ED–31, No. 10.
Japanese Patent Abstract No. 61–248532 (Mitsui), dated Nov. 5, 1986.
IEEE Transactions on Electron Devices, Jan. 1981, vol. ED–28, No. 1.
"Formation of High Quality Storage Capacitor Dielectrics by in–situ Rapid Thermal Reoxidation of $SI_3N_4$ Films in $N_2O$ Ambient", IEEE Electron Device Letters, vol. 15, No. 8, Aaugust 1994, pp. 266–268.

* cited by examiner

Primary Examiner—John F. Niebling
Assistant Examiner—Walter L. Lindsay, Jr.
(74) Attorney, Agent, or Firm—Herbert L. Lerner; Laurence A. Greenberg; Werner H. Stemer

(57) ABSTRACT

A method for producing a memory cell includes masking a desired polysilicon structure with an oxidation-inhibiting layer, preferably a nitride layer. The polysilicon above source/drain regions and field regions is then converted into silicon dioxide. At the same time, filling with silicon dioxide is effected between adjacent polysilicon paths. The field oxide thickness is increased by the conversion of polysilicon in the field regions as well. A second polysilicon layer is applied over a field region, with inclusion of the oxidation-inhibiting layer present there. One electrode of a capacitor is produced therefrom through the use of marking and etching, with the first polysilicon situated under the oxidation-inhibiting layer forming another electrode and the oxidation-inhibiting layer forming a dielectric. The structure provides a less complex masking and etching technique as well as improved reliability of the components.

10 Claims, 2 Drawing Sheets

METHOD FOR PRODUCING A MEMORY CELL

CROSS-REFERENCE TO RELATED APPLICATION

This application is a continuation of International Application Ser. No. PCT/DE96/01477, filed Aug. 7, 1996, which designated the United States.

BACKGROUND OF THE INVENTION

Field of the Invention

The invention relates to a method for producing a memory cell in an integrated circuit starting from a whole-area silicon layer on a dielectric.

Memory cells are EEPROMs and flash EEPROMs. The silicon layer may be monocrystalline, polycrystalline or amorphous silicon. The dielectric which is used is usually silicon dioxide, for example as a gate oxide, or silicon nitride.

In the production of memory cells of that type, a polysilicon layer for a following structuring on a dielectric is generally produced in the course of the first method steps. The desired structuring, in particular of transistor gates, is carried out through the use of photolithography. The etching processes which are used in that case make very high requirements of the photoresist. The wet-chemical etching processes, in particular, produce relatively large, greatly varying undercuts and lead, in principle, to concave polysilicon edges which can only be treated with difficulty from the standpoints of production engineering and planarization.

In polysilicon etching processes, there is the risk of the gate oxide situated under the polysilicon becoming damaged. Since, moreover, the selectivity between the polysilicon and the silicon oxide is insufficient during etching, in a manner dictated by the system, the gate oxide is thinned in an unreproducible manner outside the gate regions in the source/drain regions which are to be produced later, with the result that the gate oxide, for defined source/drain implantation, has to be completely removed and replaced by an oxide that is to be newly formed. That necessitates a further wet-chemical etching process.

The last-mentioned etching produces a hollow groove in the gate oxide under the polysilicon gate edge, which produces a nonhomogeneous, difficult-to-control transition from the gate to the source/drain region with corresponding yield and reliability risks for the transistor. With regard to cleaning and to the oxidation behavior, such a hollow groove can only be controlled with difficulty in terms of process engineering. In particular, the insulation strength of an insulation oxide, formed thereon, with respect to a second polysilicon layer, for example in an EEPROM process, is adversely influenced by this fact.

Furthermore, for the purpose of producing MOS transistors, German Published, Non-Prosecuted Patent Application 27 39 662 discloses covering the silicon layer with a layer which serves as an oxidation protection, structuring the oxidation protection layer through the use of photolithography in order to produce a mask through the use of etching the oxidation protection layer and uncovering the polysilicon in the unmasked regions, and converting the polysilicon in the uncovered regions into silicon dioxide through the use of local oxidation.

IEEE Transactions on Electron Devices, Vol. ED 28, No.1, January 1981, pages 77–82 and Vol. ED 31, No.10, October 1984, pages 1413 to 1419 describes the production of a MOS circuit and of an EPROM. Furthermore, Published Japanese Patent Application 57-42169 and Published European Patent Application 0 294 699 A2 describe methods for producing memory cells. However, a relatively large number of method steps are required for producing a dielectric.

SUMMARY OF THE INVENTION

It is accordingly an object of the invention to provide a method for producing a memory cell, which overcomes the hereinafore-mentioned disadvantages of the heretofore-known methods of this general type and which is simple.

With the foregoing and other objects in view there is provided, in accordance with the invention, a method for producing a memory cell having a transistor and a capacitor in an integrated circuit, which comprises initially providing a whole-area polysilicon layer; covering the polysilicon layer with an oxidation protection layer; structuring the oxidation protection layer by photo-lithography to produce a mask covering a gate region and a field region of the transistor by etching the oxidation protection layer and uncovering the polysilicon in unmasked regions, causing the oxidation protection layer remaining over the field region to form a dielectric and the underlying polysilicon to form a first electrode of the capacitor; converting the polysilicon of the polysilicon layer in regions freed from the oxidation protection layer into silicon dioxide by local oxidation; applying a further polysilicon layer with an inclusion of a remaining oxidation protection layer; applying and structuring a photoresist mask to cover a region of the further polysilicon layer disposed above the field region for forming a second electrode of the capacitor; producing the second electrode of the capacitor by etching the further polysilicon layer in the unmasked regions; and if appropriate removing the oxidation protection layer in regions not required for a remainder of the production process.

A basic concept of the invention may thus be seen in the fact that the structuring of the polysilicon, that is to say the removal of unnecessary polysilicon areas, is achieved not by conventional etching, but by conversion into silicon dioxide. The invention has the advantage of causing no gate oxide overetching and no associated hollow groove formation under the polysilicon edge to arise, with the result that a homogeneous transition in the gate oxide from the gate region to the source/drain region is provided in the case of MOS transistors. Furthermore, the polysilicon side edge is completely embedded in a homogeneously grown oxide having a thickness which corresponds approximately to at least that of the polysilicon. The insulation strength with respect to an optionally superior, second polysilicon layer, as in the case of an EEPROM, for example, is thereby determined only by the planar and therefore easy-to-control thickness of the nitride layer originally serving as a structuring mask for the first polysilicon layer or, if appropriate, of a different dielectric, since the limiting influence of the polysilicon edge is no longer present.

Furthermore, the invention avoids the disadvantage existing with conventional methods in the case of MOS transistors, in which a process-dictated abrupt transition in the gate oxide thickness at the gate edge from the gate to the source/drain region leads to a locally higher field strength between the gate edge and the source/drain region. Instead, a steady increase in the gate oxide thickness at the transition from the gate to the source/drain region is produced by the oxidation process. This avoids local field strength peaks with the consequence of amplified degradation of the transistor parameters in this critical region. The transistor reliability is increased in this way, in particular at higher operating voltages of the kind which are customary in EEPROM applications, for example.

Since the polysilicon edge produced by the oxidation according to the invention has a convex profile, this convex gate edge also contributes to avoiding the local field strength peaks and thus to better transistor reliability.

Furthermore, the invention achieves a sufficiently high breakdown voltage of the source/drain regions, which is very advantageous, for example, in EEPROM applications again. In combination processes, for example in the production of so-called embedded memories, it is therefore possible for source/drain regions of low-voltage logic transistors that are usually produced at a later point in time to be independently produced and optimized with fewer requirements on the dielectric strength. In the production of MOS transistors, it is advantageous that before the removal of the photoresist mask used during the photolithography, the source/drain implantation is effected through the uncovered silicon. The small doping gradient, which is responsible for the high breakdown voltage, of the source/drain diffusion for EEPROM applications, for example, is based on the fact that the implantation takes place relatively at the beginning of the entire production process and before the oxidation of the polysilicon which activates the implanted silicon dioxide and drives it into the silicon substrate.

The invention also avoids the disadvantage of conventional etching processes in which the system-dictated gaps between the polysilicon paths lead to planarization problems in the subsequent planes. They can only be resolved at great expense through the use of deposition and etching back as well as chemical mechanical polishing. In contrast, the invention has the advantage of providing a filling with silicon oxide between adjacent polysilicon paths which has been formed from the polysilicon at this location that has not been used in any case and is to be removed. Additional method steps for planarization can thus be obviated.

The invention also overcomes a disadvantage of conventional etching processes which lead to a thinning of the field oxide and a corresponding decrease in the field oxide insulation properties, on the field oxide in those regions where the polysilicon has been removed. That loss then has to be compensated for by an increase in the field doping, but that in turn may have an adverse influence on certain transistor properties, such as breakdown and narrow width properties, for example, due to the resulting increase in the doping gradient at the Locos edge. In contrast thereto, the invention has the advantage that even in the field regions, unrequired polysilicon is converted into oxide, with the result that the field oxide thickness is increased there by the corresponding amount. The thickness increase corresponds essentially to the original polysilicon thickness. This results in an increase, if appropriate, in the threshold voltage of a parasitic field oxide transistor for the overlying planes, such as the metallization layers, for example, or a possible second polysilicon plane.

In accordance with another mode of the invention, there is provided a production method which comprises curving the oxidation protection layer upward at lateral ends.

In accordance with a further mode of the invention, there is provided a production method which comprises carrying out the polysilicon conversion by thermal oxidation.

In accordance with an added mode of the invention, the oxidation protection layer is formed of at least one nitride layer.

In accordance with an additional mode of the invention, particularly good results are obtained by forming the nitride layer as an oxide-nitride (ON) sandwich or as an oxide-nitride-oxide sandwich layer (ONO layer) or as a nitrided oxide layer. Since all of these masking layers may be very thin, it is also possible to etch them by using simple wet-chemical agents with a tolerable size loss. Therefore, only low requirements are made of the stability of the photoresist.

In accordance with yet another mode of the invention, there is provided a production method which comprises carrying out a source/drain implantation through the uncovered silicon before the removal of the photomask used during the photolithography, for producing a MOS transistor.

In accordance with a concomitant mode of the invention, there is provided a production method which comprises carrying out the conversion of the polysilicon into silicon dioxide in the source/drain regions as well as the field oxide regions.

Other features which are considered as characteristic for the invention are set forth in the appended claims.

Although the invention is illustrated and described herein as embodied in a method for producing a memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
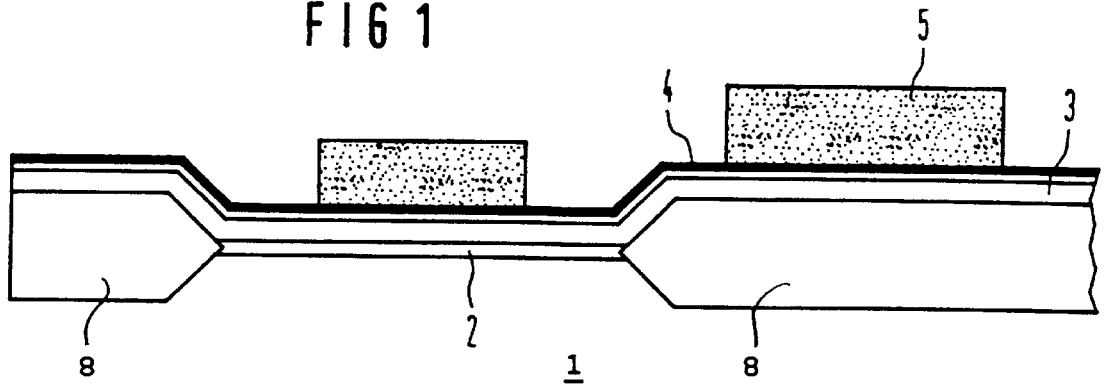
FIGS. 1 to 5 are fragmentary, diagrammatic, cross-sectional views each illustrating a method step in a production of a transistor and of a capacitor as an EEPROM memory cell.

Referring now to the figures of the drawings in detail and first, particularly, to FIG. 1 thereof, there is seen a silicon substrate 1 on which a silicon oxide layer 2 is situated in source/drain regions and between field oxide regions 8.

According to FIG. 1, a first polysilicon layer 3 (poly1) is produced on the silicon oxide layer 2. An oxide-nitride layer 4 (ON) is applied to the polysilicon layer 3 and then a photoresist mask 5 is applied to the oxide-nitride layer 4. The photoresist mask 5 corresponds to desired polysilicon structures and leaves the source/drain regions free. The oxide-nitride layer 4 is then removed at the resist-free locations through the use of an etching process, with the result that the polysilicon layer 3 is uncovered at these locations.

Figure 2:
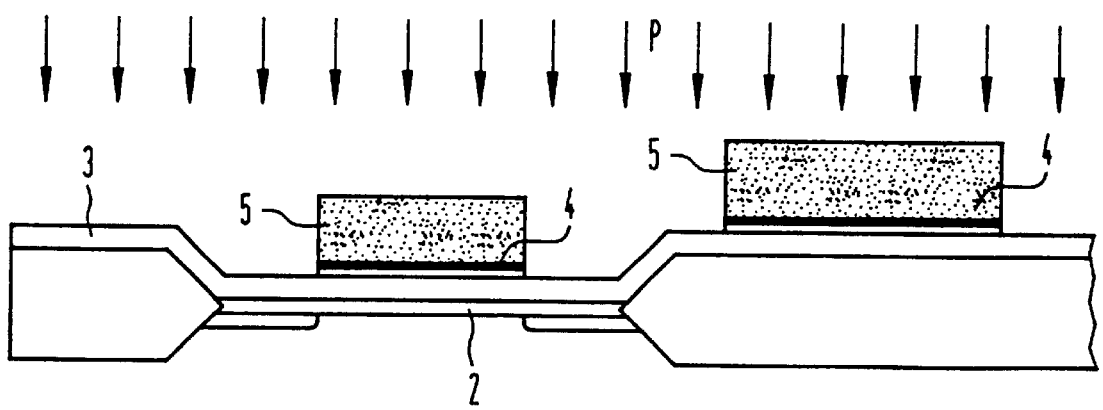
Figure 3:
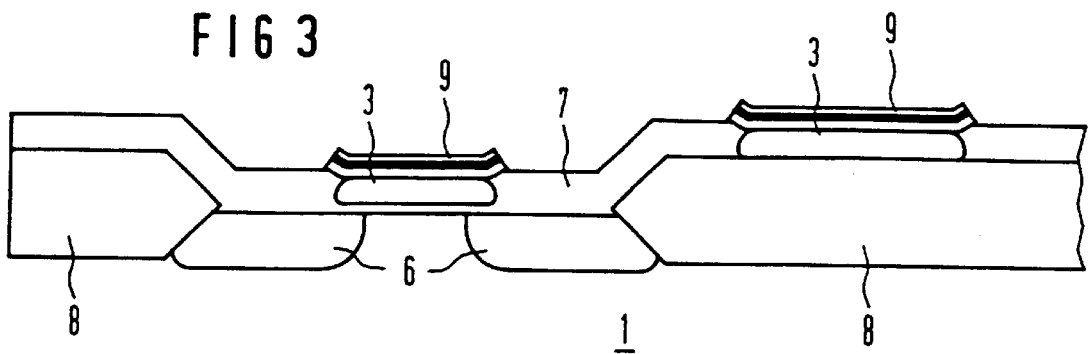

According to FIG. 2 implantation of source/drain regions is carried out through the uncovered polysilicon layer 3 immediately after the etching, and with the photoresist mask 5 being retained, by using phosphorus in the example illustrated. Subsequently, according to FIG. 3, after removal of the photoresist mask 5 the uncovered polysilicon is converted into silicon dioxide 7 through the use of thermal oxidation with correspondingly selected temperature/gas conditions. In this process the oxide-nitride layer 4 having the structure produced according to FIG. 1 serves as a mask.

At the end of the oxidation, the resulting polysilicon edge has a convex profile. Moreover, during the oxidation, an implanted element 6 is activated and driven into the silicon substrate 1. After the end of the oxidation, interspaces between the polysilicon structure are filled with thermal silicon dioxide and the polysilicon that was originally present is completely oxidized through at this point.

Even above the field regions 8, the unused polysilicon is converted into silicon dioxide 7, with the result that the field oxide thickness has increased there by somewhat more than an amount corresponding to the original polysilicon thickness. Furthermore, an oxide-nitride-oxide sandwich 9 has been produced from the oxide-nitride layer 4 by superficial oxidation of the nitride layer.

Figure 4:
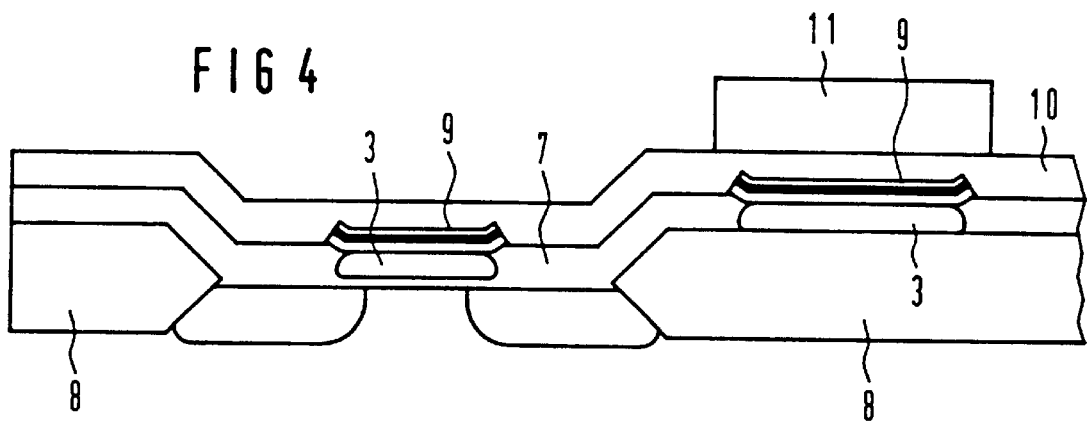

According to FIG. 4, the production process is continued by applying a second polysilicon layer 10 in order to produce a capacitance between the first and second polysilicon layers 3, 10. A further photoresist mask 11 is applied to the second polysilicon layer 10 above the capacitor region and is structured. The photoresist mask 11 is used to produce the second polysilicon layer 10 as an upper electrode of the desired capacitance and as a control gate of the EEPROM. In this connection, FIG. 4 reveals that the breakdown field strengths are determined only by the properties of the planar ONO layer 9. Furthermore, outside the active regions, the effective field oxide thickness is increased by the amount of this field oxide thickness.

Figure 5:
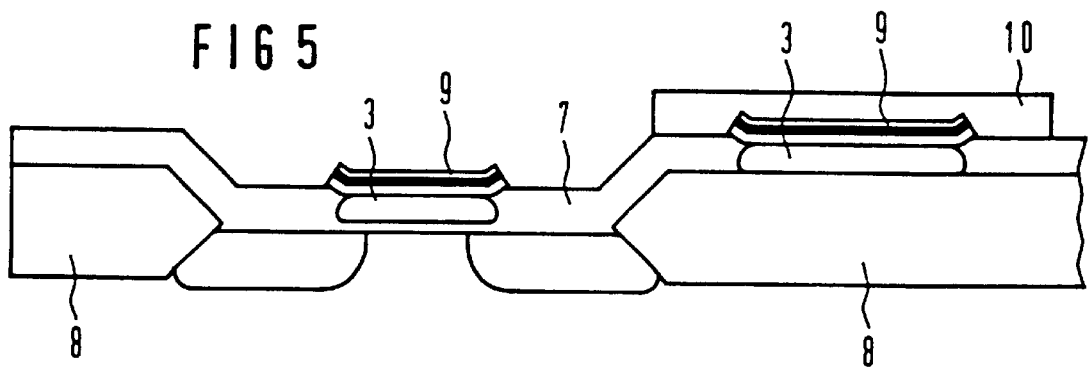

FIG. 5 shows that the polysilicon layer 10 has been removed except in the vicinity of the layer 9 and that the photoresist mask 11 has been removed.

I claim:

1. In a method for producing a memory cell having a transistor and a capacitor in an integrated circuit, the improvement which comprises:

initially providing a whole-area polysilicon layer;

covering the polysilicon layer with an oxidation protection layer;

structuring the oxidation protection layer by photolithography to produce a mask covering a gate region and a field region of the transistor by etching the oxidation protection layer and uncovering the polysilicon in unmasked regions, causing the oxidation protection layer remaining over the field region to form a dielectric and the underlying polysilicon to form a first electrode of the capacitor;

converting the polysilicon of the polysilicon layer in regions freed from the oxidation protection layer into silicon dioxide by local oxidation and thereby structuring the polysilicon layer;

applying a further polysilicon layer with an inclusion of a remaining oxidation protection layer;

applying and structuring a photoresist mask to cover a region of the further polysilicon layer disposed above the field region for forming a second electrode of the capacitor; and producing the second electrode of the capacitor by etching the further polysilicon layer in the unmasked regions.

2. The production method according to claim 1, which comprises removing the oxidation protection layer in regions not required for a remainder of the production process.

3. The production method according to claim 1, which comprises curving the oxidation protection layer upward at lateral ends.

4. The production method according to claim 1, which comprises carrying out the polysilicon conversion by thermal oxidation.

5. The production method according to claim 1, which comprises forming the oxidation protection layer of at least one nitride layer.

6. The production method according to claim 4, which comprises forming the nitride layer of oxide-nitride.

7. The production method according to claim 4, which comprises forming the nitride layer of an oxide-nitride sandwich.

8. The production method according to claim 4, which comprises forming the nitride layer of an oxide-nitride-oxide.

9. The production method according to claim 1, which comprises carrying out a source/drain implantation through the uncovered silicon before the removal of the photoresist mask used during the photolithography, for producing a MOS transistor.

10. The production method according to claim 9, which comprises carrying out the conversion of the polysilicon into silicon dioxide in the source/drain regions as well as the field oxide regions.

* * * * *